(12) United States Patent
Otoguro et al.

(10) Patent No.: US 9,019,332 B2
(45) Date of Patent: Apr. 28, 2015

(54) COVER MEMBER, LIGHT SCANNING APPARATUS, AND IMAGE FORMING APPARATUS

(71) Applicant: Canon Kabushiki Kaisha, Tokyo (JP)

(72) Inventors: Yasuaki Otoguro, Abiko (JP); Takehiro Ishidate, Tokyo (JP)

(73) Assignee: Canon Kabushiki kaisha, Tokyo (JP)

( * ) Notice: Subject to any disclaimer, the term of this patent is extended or adjusted under 35 U.S.C. 154(b) by 0 days.

(21) Appl. No.: 14/306,509

(22) Filed: Jun. 17, 2014

(65) Prior Publication Data

US 2014/0375742 A1 Dec. 25, 2014

(30) Foreign Application Priority Data

Jun. 24, 2013 (JP) ................. 2013-131657
Jun. 13, 2014 (JP) ................. 2014-122592

(51) Int. Cl.
| | |
|---|---|
| *B41J 2/435* | (2006.01) |
| *G03G 15/04* | (2006.01) |
| *G02B 26/12* | (2006.01) |
| *H05K 5/03* | (2006.01) |

(52) U.S. Cl.
CPC ............... *G03G 15/04* (2013.01); *G02B 26/12* (2013.01); *H05K 5/03* (2013.01)

(58) Field of Classification Search
USPC ......... 347/138, 152, 231, 242, 243, 245, 257, 347/259–261, 263
See application file for complete search history.

(56) References Cited

U.S. PATENT DOCUMENTS

| | | | | |
|---|---|---|---|---|
| 5,621,451 A | * | 4/1997 | Sugiura et al. | ................. 347/112 |
| 7,203,444 B2 | * | 4/2007 | Yamazaki | ........................ 399/98 |
| 7,755,655 B2 | * | 7/2010 | Kawasaki | ..................... 347/138 |

FOREIGN PATENT DOCUMENTS

JP 2009-265503 A 11/2009

* cited by examiner

*Primary Examiner* — Hai C Pham

(74) *Attorney, Agent, or Firm* — Fitzpatrick, Cella, Harper & Scinto

(57) ABSTRACT

A cover member to be attached to a housing including a bottom portion and a side wall, the cover member including: a closing surface configured to close an opening surrounded by the side wall; at least three protruding portions protruding from the closing surface so as to be located on an inside of the housing; and a protection portion configured to protect a circuit board fixed to the side wall, the protection portion having: a first opposed portion opposed to the circuit board and provided to stand on the closing surface; a second opposed portion opposed to the circuit board and protruding with respect to the first opposed portion away from the circuit board; and a connecting portion configured to connect the first opposed portion and the second opposed portion, wherein a length of the at least three protruding portions is larger than a length of the first opposed portion.

19 Claims, 11 Drawing Sheets

COVER MEMBER, LIGHT SCANNING APPARATUS, AND IMAGE FORMING APPARATUS

BACKGROUND OF THE INVENTION

1. Field of the Invention

The present invention relates to a cover member of a light scanning apparatus to be used in an image forming apparatus.

2. Description of the Related Art

As an electrophotographic image forming apparatus, a copying machine, a printer, a facsimile, and a multi-function device of those machines are exemplified. As a light scanning apparatus to be used in an image forming apparatus, a light scanning apparatus having the following configuration has been known. That is, the light scanning apparatus forms an electrostatic latent image on a photosensitive member in such a manner that a rotary polygon mirror deflects a light beam emitted from a light source, and an optical component such as a lens and a mirror guides the deflected light beam onto a photosensitive surface of the photosensitive member.

An overview of components of a generally adopted related-art light scanning apparatus will be described below. A semiconductor laser device is provided in a light source portion, and a circuit board connected to the light source portion is arranged on an outer side of a side wall of a housing. The circuit board is fixed on the housing with a screw, a spring member, or an adhesive. On the circuit board, a variable volume is fixed. The variable volume adjusts a light intensity of a light beam emitted from the light source portion to a light intensity corresponding to characteristics of the image forming apparatus. The variable volume is adjusted when initializing the apparatus at the time of assembly of the apparatus in a factory. The variable volume is adjusted to a default value, and thus a default light intensity of the light beam corresponding to the characteristics of the image forming apparatus is determined. With reference to the default light intensity, the light intensity of the light beam at the time of image formation is controlled.

At the time of assembly of the light scanning apparatus, at the time of transportation of the light scanning apparatus, and at the time of operation of mounting the light scanning apparatus into the image forming apparatus, a hand and cloth of an operator, a packing material for transportation, or a component provided at a periphery of the light scanning apparatus may be sometimes brought into contact with a control circuit board. In this case, setting of the variable volume provided on the circuit board is fluctuated, and thus the default value may be deviated. As a result, such image failure occurs that density of an output image is light or dark. Adjustment by the variable volume needs a dedicated jig capable of high-precision measurement. In a case where the variable volume is deviated from the default value after the light scanning apparatus is mounted in the image forming apparatus, the following problem arises. Normally, the light scanning apparatus is assembled in a clean room in which a dust amount in the air is controlled or in an environment approximate to the clean room. In a case where the variable volume is changed, in order to correct the default light intensity of the light beam, after cleaning the light scanning apparatus, the light scanning apparatus needs to be brought again into an assembly line for the light scanning apparatus so that the assembly operation of the apparatus may consume a lot of time.

To address the above-mentioned problem, in Japanese Patent Application Laid-Open No. 2009-265503, there is proposed a configuration in which, in addition to a main cover configured to protect an inside of the light scanning apparatus from contamination, a protection member configured to cover the circuit board is provided. Further, there is also proposed a configuration in which a projecting portion is formed on a part of the main cover and the projecting portion covers the circuit board.

However, in the configuration disclosed in Japanese Patent Application Laid-Open No. 2009-265503 in which the protection member is provided, a step of mounting a member configured to cover the circuit board is required in assembling steps, and hence the operation may be complicated. Meanwhile, in the configuration in which the projecting portion is formed on the part of the main cover, complicated operation is not caused, but the following problem arises. That is, the projecting portion formed on the cover member disables stable stacking of a plurality of cover members, and hence efficiency of conveying the cover members in a factory is reduced.

SUMMARY OF THE INVENTION

The present invention has been made under such circumstances, and provides a cover member, a light scanning apparatus, and an image forming apparatus which improve transport efficiency while preventing deformation and breakage of the cover member.

In order to solve the above-mentioned problems, the present invention has the following configurations.

According to an embodiment of the present invention, there is provided a cover member to be attached to a housing including a bottom portion on which a rotary polygon mirror is mounted and a side wall provided to stand on the bottom portion, the cover member comprising: a closing surface configured to close an opening surrounded by the side wall, the rotary polygon mirror being passed through the opening when the rotary polygon mirror is to be mounted on the bottom portion; at least three protruding portions protruding from the closing surface so as to be located on an inside of the housing in a state in which the cover member is attached to the housing; and a protection portion configured to protect a circuit board fixed to the side wall of the housing, the protection portion having: a first opposed portion opposed to the circuit board and provided to stand on the closing surface; a second opposed portion opposed to the circuit board and protruding with respect to the first opposed portion away from the circuit board; and a connecting portion configured to connect the first opposed portion and the second opposed portion, wherein a length S of the at least three protruding portions from the closing surface in a direction perpendicular to the closing surface and a length T of the first opposed portion in the direction perpendicular to the closing surface satisfy a relation of S>T.

According to an embodiment of the present invention, there is provided a light scanning apparatus, comprising: a light source configured to emit a light beam; a rotary polygon mirror configured to deflect the light beam to cause the light beam emitted from the light source to scan a photosensitive member in a scanning direction; an optical member configured to guide the light beam deflected by the rotary polygon mirror to the photosensitive member; a housing configured to contain the light source, the rotary polygon mirror, and the optical member; and the cover member described above.

According to an embodiment of the present invention, there is provided an image forming apparatus, including: a photosensitive member; the light scanning apparatus described above, which irradiates a light beam onto the photosensitive member to form an electrostatic latent image; a developing unit configured to develop the electrostatic latent image formed by the light scanning apparatus, to thereby form a toner image; and a transfer unit configured to transfer the toner image formed by the developing unit onto a recording medium.

Further features of the present invention will become apparent from the following description of exemplary embodiments with reference to the attached drawings.

DESCRIPTION OF THE EMBODIMENTS

Now, modes for carrying out the present invention will be described in detail according to embodiments with reference to the drawings.

Configuration of General Light Scanning Apparatus

Figure 6:
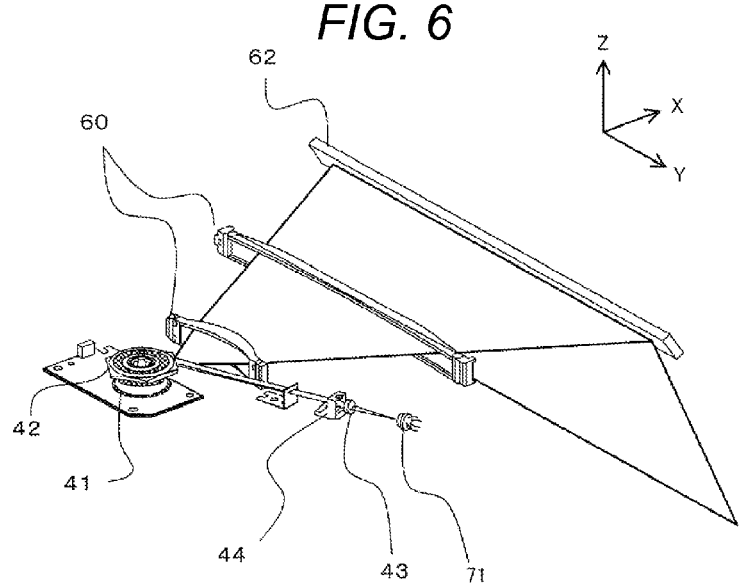
FIG. 6 is a diagram illustrating a configuration of the light scanning apparatus.

FIG. 6 illustrates an overview of components of a light scanning apparatus. The light scanning apparatus includes a semiconductor laser (hereinafter referred to as a light source portion) 71 configured to emit laser light (hereinafter referred to as a light beam), and a polygon mirror (hereinafter referred to as a rotary polygon mirror) 42 configured to deflect the light beam so as to cause the light beam to scan a photosensitive drum (photosensitive member). Further, the light scanning apparatus includes a polygon motor unit 41 configured to rotate the rotary polygon mirror 42, and optical members.

As the optical members, the light scanning apparatus includes a collimator lens 43 and a cylindrical lens 44 which shape the light beam entering the rotary polygon mirror 42. Further, as the optical members, the light scanning apparatus includes at least one fθ lens (hereinafter referred to as an optical lens) 60 configured to convert the light beam deflected by the rotary polygon mirror 42 into scanning light which scans the photosensitive drum at uniform velocity. In addition, the light scanning apparatus includes a reflection mirror 62 configured to guide the light beam deflected by the rotary polygon mirror 42 onto the photosensitive drum. The light source portion 71 is fixed to a holding member configured to hold the light source portion 71, and the holding member is fixed to a side wall of a housing of the light scanning apparatus. The light scanning apparatus is configured to allow the light beam to enter an inside of the light scanning apparatus from a hole portion formed in the housing, and a control circuit board is similarly fixed to the housing with a screw or an elastic member. A variable volume is provided on the control circuit board. In order to output a desired value corresponding to the photosensitive drum and a developing apparatus of the image forming apparatus at a spot imaging position, a light intensity of the light beam emitted from the light source portion 71 is adjusted by the variable volume described below.

Special lens effective surfaces, typified by an aspheric surface, have increasingly been adopted as the optical lens 60 with a view to improving scanning performance. A highly reflective mirror has increasingly been adopted as the reflection mirror 62 in order to reduce a light intensity loss along with increase in speed of the apparatus. The polygon motor unit 41 often adopts a configuration in which a rotary polygon mirror having a plurality of reflecting surfaces on an outer circumference of the rotary polygon mirror is rotated at high speed to deflect an incident light beam in a desired direction at high speed. The light intensity of the light beam scanned on a surface to be scanned is closely related to image density. Unintentional fluctuation in light intensity of the light beam causes a phenomenon that image density of an image formed on a recording sheet being a recording medium is light or dark. Therefore, as described above, there is proposed a light scanning apparatus including a cover member that includes a projecting portion configured to protect the control circuit board in order not to fluctuate the adjusted variable volume of the control circuit board. However, the related-art cover member including the projecting portion has a problem in that it is impossible to increase transportation efficiency while preventing deformation and breakage of the cover member.

Note that, in the following description, a rotation axis direction of the rotary polygon mirror of the polygon motor unit 41 is referred to as a Z-axis direction. A main scanning direction being a scanning direction of the light beam, or a longitudinal direction of the optical lens 60 and the reflection mirror 62 is referred to as a Y-axis direction. A direction perpendicular to the Y-axis and the Z-axis is referred to as an X-axis direction.

First Embodiment

Image Forming Apparatus

Figure 1:
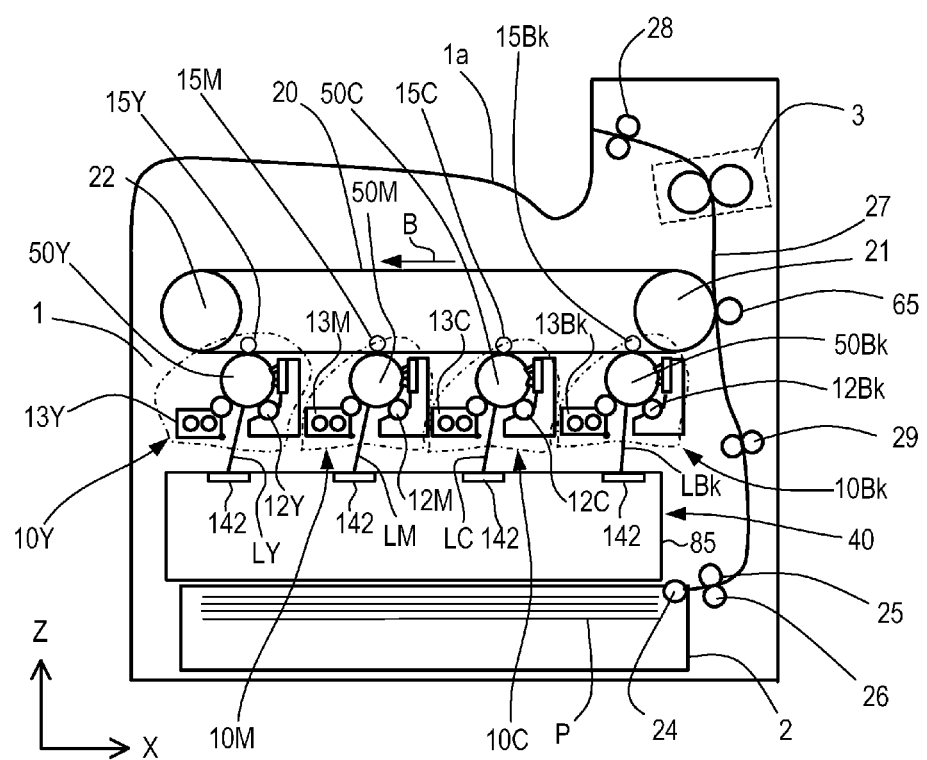
FIG. 1 is a diagram illustrating an overview of an image forming apparatus according to first to forth embodiments.

A configuration of an image forming apparatus according to a first embodiment of the present invention will be described. FIG. 1 is a schematic configuration diagram illustrating an entire configuration of a tandem-type color laser beam printer according to the embodiment. The laser beam printer (hereinafter simply referred to as a printer) includes four image forming engines (image forming portions) 10Y, 10M, 10C, and 10Bk (indicated by the dashed lines) each configured to form a toner image of yellow (Y), magenta (M), cyan (C), or black (Bk). Further, the printer includes an intermediate transfer belt 20 onto which the toner image is transferred from each of the image forming engines 10Y, 10M, 10C, and 10Bk. The printer transfers the toner image transferred in multiple layers on the intermediate transfer belt 20 onto a recording sheet P being a recording medium, and thus forms a full color image. In the following description, symbols Y, M, C, and Bk representing respective colors are omitted unless otherwise necessary.

The intermediate transfer belt 20 is formed into an endless belt, and is passed over a pair of belt conveyance rollers 21 and 22. While the intermediate transfer belt 20 is rotated and moved in the direction indicated by the arrow B, the toner image formed by the image forming engine 10 of each color is transferred onto the intermediate transfer belt 20. Further, a secondary transfer roller 65 is arranged at a position opposite to the belt conveyance roller 21 across the intermediate transfer belt 20. The recording sheet P is passed between the secondary transfer roller (transfer unit) 65 and the intermediate transfer belt 20 in pressure contact with each other, and the toner image is transferred on the recording sheet P from the intermediate transfer belt 20. The above-mentioned four image forming engines 10Y, 10M, 10C, and 10Bk are arranged in parallel below the intermediate transfer belt 20. Onto the intermediate transfer belt 20, each of the image forming engines 10Y, 10M, 10C, and 10Bk transfers the toner image formed in accordance with image information of a corresponding color (hereinafter this operation is referred to as primary transfer). The four image forming engines 10 are arranged along a rotation direction (indicated by the arrow B) of the intermediate transfer belt 20 in the following order: the image forming engine 10Y for yellow; the image forming engine 10M for magenta; the image forming engine 10C for cyan; and the image forming engine 10Bk for black.

Further, a light scanning apparatus 40 is arranged below the image forming engines 10. In accordance with the image information, the light scanning apparatus 40 exposes with light a photosensitive drum 50 serving as a photosensitive member provided to each of the image forming engines 10. The light scanning apparatus 40 is shared by all of the image forming engines 10Y, 10M, 10C, and 10Bk, and includes four light source portions (not shown) each configured to emit the light beam modulated in accordance with the image information of each color. Further, the light scanning apparatus 40 includes the rotary polygon mirror 42 configured to deflect the light beam so as to cause the light beam corresponding to each photosensitive drum 50 to scan the photosensitive drum 50 along a rotation axis direction (Y-axis direction) of the photosensitive drum 50, and the polygon motor unit 41 configured to rotate the rotary polygon mirror 42. By the optical members mounted on the light scanning apparatus 40, the light beam deflected by the rotary polygon mirror 42 is guided onto the photosensitive drum 50 (onto the photosensitive member), to thereby expose the photosensitive drum 50 with light.

Each image forming engine 10 includes the photosensitive drum 50, and a charging roller (charging member) 12 configured to uniformly charge the photosensitive drum 50 to electric potential of a background portion. Further, each image forming engine 10 includes a developing device (developing unit) 13 configured to develop an electrostatic latent image, which is formed on the photosensitive drum 50 through exposure with the light beam, to thereby form the toner image. The developing device 13 forms the toner image in accordance with the image information of each color on the photosensitive drum 50.

At a position opposite to the photosensitive drum of each image forming engine 10, a primary transfer roller (transfer unit) 15 is arranged across the intermediate transfer belt 20. A predetermined transfer voltage is applied to the primary transfer roller 15, and thus the toner image on the photosensitive drum 50 is transferred onto the intermediate transfer belt 20.

Meanwhile, the recording sheet P is fed from a feed cassette 2 provided in a lower portion of a printer housing 1 into an inside of the printer, specifically, into a secondary transfer position at which the intermediate transfer belt 20 and the secondary transfer roller 65 are in contact with each other. A pick-up roller 24 configured to draw out the recording sheet P contained in the feed cassette 2, and a feed roller 25 are arranged in parallel at an upper portion of the feed cassette 2. Further, a retard roller 26 configured to prevent a double feed of the recording sheets P is arranged at a position opposite to the feed roller 25. A conveyance path 27 for the recording sheet P in an inside of the printer is provided substantially vertically along a right side surface of the printer housing 1. The recording sheet P that is drawn out from the feed cassette 2 positioned at a bottom portion of the printer housing 1 is conveyed upward through the conveyance path 27 and fed to registration rollers 29 which control timing of causing the recording sheet P to enter the secondary transfer position. Then, after the toner image is transferred on the recording sheet P at the secondary transfer position, the recording sheet P is fed to a fixing device 3 (illustrated by the broken line) provided on a downstream side in a conveyance direction. The recording sheet P on which the toner image is fixed by the fixing device 3 is delivered via delivery rollers 28 onto a delivery tray 1a provided at an upper portion of the printer housing 1. Note that, irradiation windows 142 serve as transmission windows through which a light beam LY, a light beam LM, a light beam LC, and a light beam LBk described below are emitted from a housing 85 to the photosensitive drums 50.

In accordance with the image information of each color and an electric signal indicating to what extent the light beam is irradiated on the photosensitive drum 50, the light scanning apparatus 40 exposes with light the photosensitive drum 50 of each image forming engine 10 at a predetermined timing and a predetermined light intensity. In this way, the toner image is formed on the photosensitive drum 50 of each image forming engine 10 in accordance with the image information. In this case, in order to attain excellent image quality, a latent image formed by the light scanning apparatus 40 needs to be able to reproduce desired latent image potential by the light beam that reproduces a demanded light intensity. That is, the light scanning apparatus 40 needs to always produce a stable light intensity with respect to the demanded light intensity.

Configuration of Light Scanning Apparatus

Figure 2A:
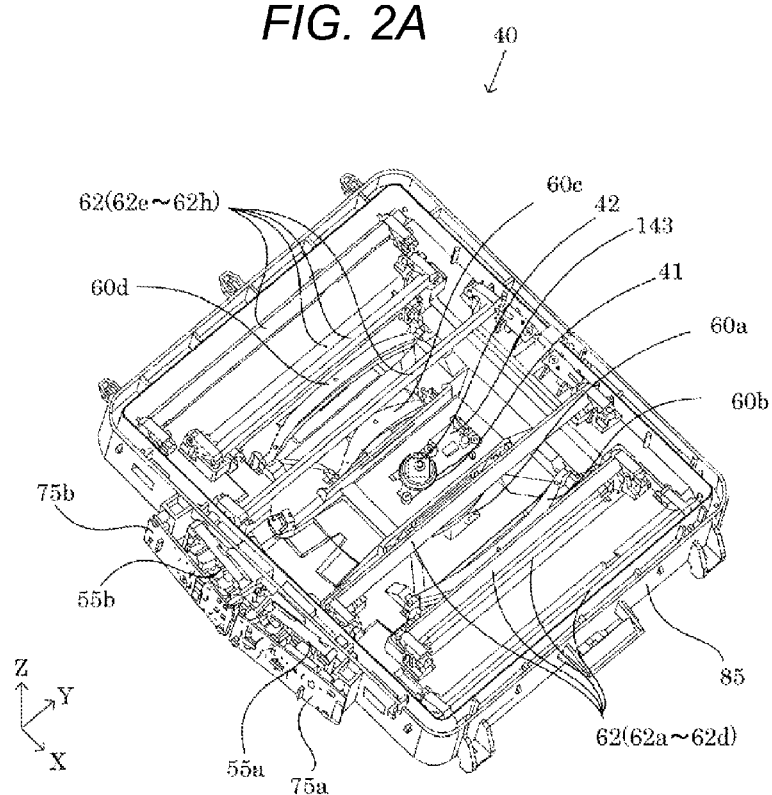
FIG. 2A is a perspective view of a light scanning apparatus according to the first embodiment.
Figure 2B:
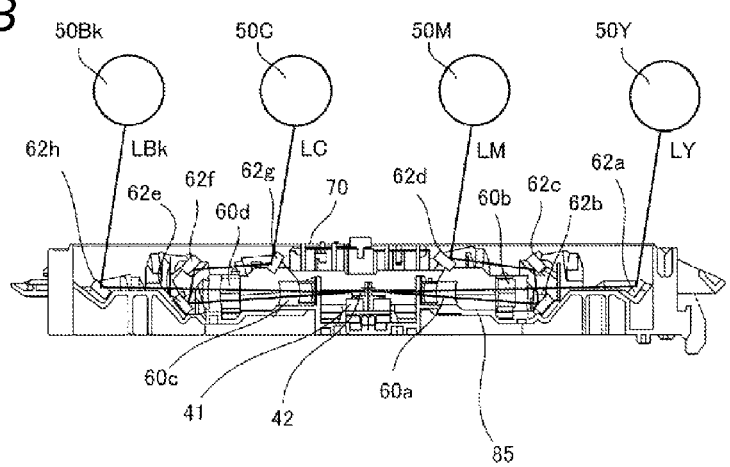
FIG. 2B is a cross-sectional view of the light scanning apparatus according to the first embodiment.
Figure 2C:
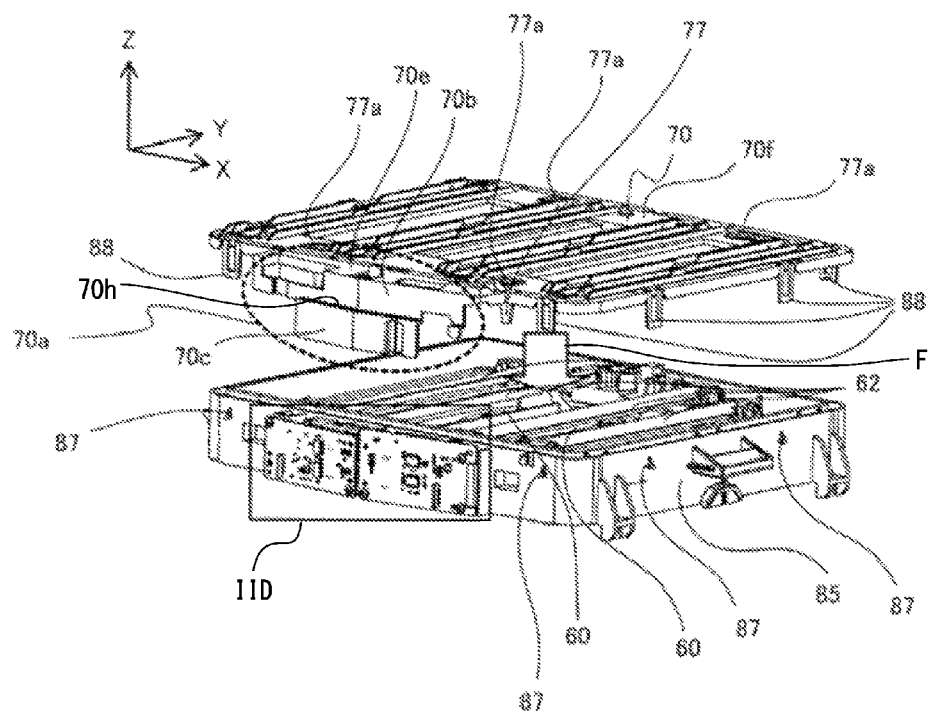
FIG. 2C is a perspective view of a cover member and a housing of the light scanning apparatus according to the first embodiment.
Figure 2D:
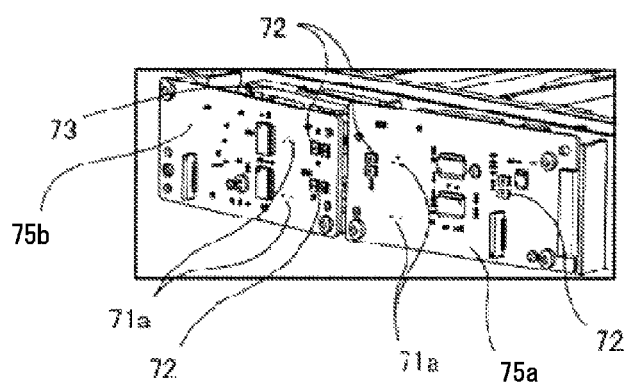
FIG. 2D is an enlarged view of a framed rectangle area IID in FIG. 2C.
Figure 2E:
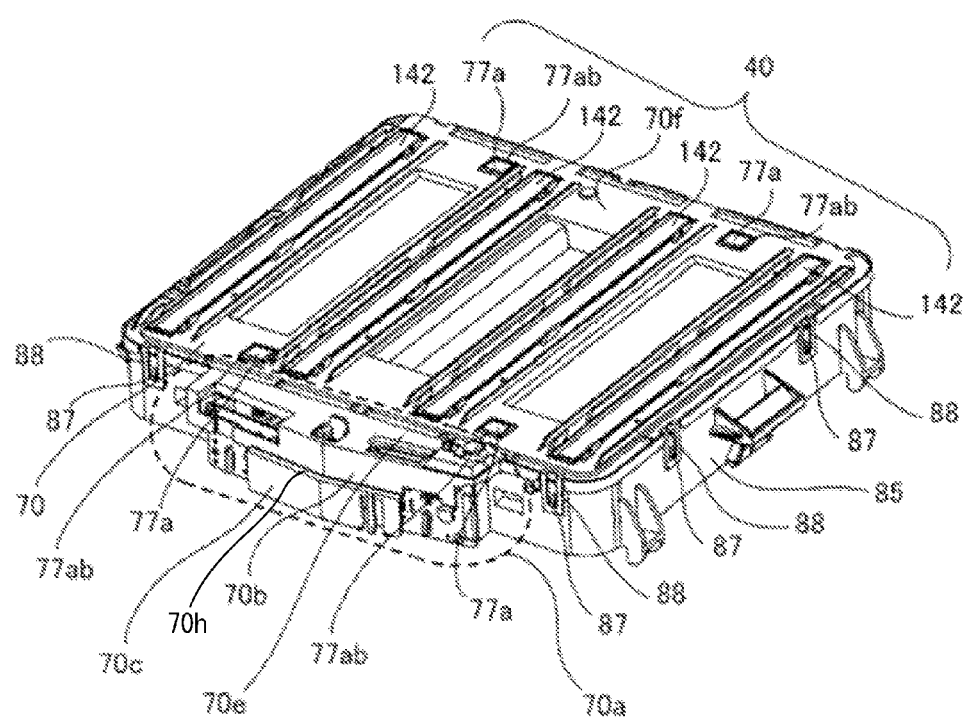
FIG. 2E is a perspective view of the light scanning apparatus according to the first embodiment in which the cover member is mounted on the housing.

FIG. 2A is a perspective view of the light scanning apparatus 40 according to the embodiment. FIG. 2B is a cross-sectional view of the light scanning apparatus 40 according to the embodiment. FIG. 2C is a perspective view of a cover member 70 and the housing 85 of the light scanning apparatus 40 according to the embodiment. FIG. 2D is an enlarged view of a framed rectangle area IID in FIG. 2C. FIG. 2E is a perspective view of the light scanning apparatus 40 according to the embodiment in which the cover member 70 is attached to the housing 85. FIG. 2D illustrates a control circuit board 75 described below. The light scanning apparatus 40 according to the embodiment includes the housing 85 in which various components are mounted, and the cover member 70 configured to cover an opening portion of the housing 85.

First, with reference to FIG. 2A, a schematic configuration of the light scanning apparatus 40 according to the embodiment will be described. On a side wall of the housing 85 of the light scanning apparatus 40 according to the embodiment, a control circuit board 75a and a light source unit 55a are fixed.

The light source unit 55a includes a holding member (not shown) to which the control circuit board 75a is fixed. Further, on the side wall of the housing 85 of the light scanning apparatus 40 according to the embodiment, a control circuit board 75b and a light source unit 55b are fixed. The light source unit 55b includes a holding member 73 (refer to FIG. 2D) to which the control circuit board 75b is fixed. A light source portion (not shown) configured to expose the photosensitive drum 50Y with light and a light source portion (not shown) configured to expose the photosensitive drum 50M with light are fixed to the light source unit 55a. Further, a light source portion (not shown) configured to expose the photosensitive drum 50C with light and a light source portion (not shown) configured to expose the photosensitive drum 50Bk with light are fixed to the light source unit 55b.

A plurality of openings are formed in the side wall of the housing 85, and the light source unit 55a and the light source unit 55b are fixed to the plurality of openings, respectively. The light beams emitted from the light source unit 55a and the light source unit 55b are emitted to an inside of the housing 85 to pass through the plurality of openings (irradiation windows 142).

The rotary polygon mirror 42, the polygon motor unit 41 configured to rotate the rotary polygon mirror 42, and a deflecting unit including a circuit board 143 configured to drive the polygon motor unit 41 are fixed to a center portion of the inside of the housing 85. The light beams emitted from the light source unit 55a are deflected by the rotary polygon mirror 42 in a +X direction. Further, the light beams emitted from the light source unit 55b are deflected by the rotary polygon mirror 42 in a −X direction.

Optical lenses 60a to 60d and reflection mirrors 62a to 62h described below are fixed to the inside of the housing 85.

Next, with reference to FIG. 2B, optical paths of the light beams LBk, LC, LM, and LY will be described. The light beam LY, which is emitted from the light source unit to correspond to the photosensitive drum 50Y, is deflected by the rotary polygon mirror 42 and enters the optical lens 60a. The light beam LY passes through the optical lens 60a, and enters the optical lens 60b. After passing through the optical lens 60b, the light beam LY is reflected by the reflection mirror 62a. The light beam LY reflected by the reflection mirror 62a passes through the irradiation window (transparent window) 142 (FIG. 2E), and scans the photosensitive drum 50Y.

The light beam LM, which is emitted from the light source unit 55 to correspond to the photosensitive drum 50M, is deflected by the rotary polygon mirror 42 and enters the optical lens 60a. The light beam LM passes through the optical lens 60a, and enters the optical lens 60b. After passing through the optical lens 60b, the light beam LM is reflected by the reflection mirror 62b, the reflection mirror 62c, and the reflection mirror 62d. The light beam LM reflected by the reflection mirror 62d passes through the irradiation window (transparent window) 142 (FIG. 2E), and scans the photosensitive drum 50M.

The light beam LC, which is emitted from the light source unit 55 to correspond to the photosensitive drum 50C, is deflected by the rotary polygon mirror 42, and enters the optical lens 60c. The light beam LC passes through the optical lens 60c, and enters the optical lens 60d. The light beam LC passes through the optical lens 60d, and is reflected by the reflection mirror 62e, the reflection mirror 62f, and the reflection mirror 62g. The light beam LC reflected by the reflection mirror 62g passes through the irradiation window (transparent window) 142 (FIG. 2E), and scans the photosensitive drum 50C.

The light beam LBk, which is emitted from the light source unit 55 to correspond to the photosensitive drum 50Bk, is deflected by the rotary polygon mirror 42 and enters the optical lens 60c. The light beam LBk passes through the optical lens 60c, and enters the optical lens 60d. After passing through the optical lens 60d, the light beam LBk is reflected by the reflection mirror 62h. The light beam LBk reflected by the reflection mirror 62h passes through the irradiation window (transparent window) 142 (FIG. 2E), and scans the photosensitive drum 50Bk.

Configuration of Housing

The housing 85 includes a bottom surface (bottom portion) parallel to an XY plane, and an outer wall (a side wall, hereinafter, also referred to as an outer peripheral portion) provided to stand on the bottom surface substantially in parallel to the Z-axis direction. In contrast to one end of the outer peripheral portion connected to the bottom surface, the other end of the outer peripheral portion defines an opening (hereinafter also referred to as an opening portion). The rotary polygon mirror 42 and other optical members pass through the opening portion at the time of assembly of the apparatus, and thus are assembled to the light scanning apparatus. The housing 85 includes engaging portions 87 formed on the housing (hereinafter referred to as housing engaging portions) with which engaging portions 88 formed on the cover member 70 (hereinafter referred to as cover engaging portions) described below are engaged. The cover engaging portions 88 and the housing engaging portions 87 form a snap fit mechanism, and the snap fit mechanism fixes the cover member 70 to the housing 85. A plurality of the light source portions 71 are provided, for example, for four colors in a case of a four-color image forming apparatus. Each light source portion 71 is fixed to the outer peripheral portion of the housing 85 in a state of being held by the holding member 73. The control circuit board 75 serving as a substrate is fixed to the outer peripheral portion of the housing 85. Similarly to the light source portions 71, the control circuit board 75 is fixed to the outer peripheral portion of the housing 85 with a screw. At this time, contact terminal portions 71a of the light source portions 71 are bonded and fixed by soldering to hole portions formed in the control circuit board 75.

Further, various electrical components are mounted on the control circuit board 75. As one of the electrical components, variable volumes 72 configured to vary a laser emission intensity of the light source portion 71 are disposed. Two variable volumes 72 are provided for each light source. One of the variable volumes 72 has a large resolution in adjusting the light intensity and is used in rough adjustment, and another of the variable volumes 72 has a small resolution in adjusting the light intensity and is used in fine adjustment.

Configuration of Cover Member

In order to prevent contamination of the optical components provided in the inside of the housing 85, the cover member 70 is fixed to the housing 85 so as to cover the opening portion of the housing 85. The cover member 70 according to the embodiment includes a first surface 70f (closing surface) configured to cover the opening portion. The first surface 70f is provided with the cover engaging portions 88 to be engaged with the housing engaging portions 87, and a protection portion 70a (portion encircled by the broken line) configured to protect the control circuit board 75 of the light source unit 55 fixed to the side wall of the housing 85. Further, the first surface 70f is provided with protruding portions 77 protruding inside a contour of the first surface 70f of the housing 85 toward the inside of the housing 85 from a surface of the first surface 70f facing the inside of the housing. Further, the cover member 70 includes the four irradiation windows 142 through which the light beam LY, the light beam LM, the light beam LC, and the light beam LBk are emitted. In addition, the cover member 70 includes protruding-portion receiving portions (hereinafter simply referred to as receiving portions) 77a. Note that, a surface opposite to the surface of the cover member 70 facing the housing 85, i.e., an outer surface of the cover member 70 is referred to as a cover-member base surface (hereinafter simply referred to as a base surface) 70e. The receiving portions 77a are formed on the backside of the surface of the cover member 70 on which the protruding portions 77 are formed, and receive the protruding portions 77 formed on another cover member 70 having the same shape.

The cover engaging portions 88 are formed at positions having no protection portion 70a in an outer portion of the cover member 70, and provided to stand on the first surface 70f of the cover member 70. When the cover member 70 is attached to the housing 85, the cover engaging portions 88 are moved along outer surfaces of the outer peripheral portion of the housing 85, and are engaged with the housing engaging portions 87 formed on the housing 85. The housing engaging portions 87 and the cover engaging portions 88 are engaged with each other, and thus the cover member 70 is fixed to the housing 85.

The protruding portions 77 are formed on the surface of the first surface 70f of the cover member 70 facing the inside of the housing 85 so as not to be in contact with various components disposed in the housing, and not to interfere the optical paths of the light beams travelling in the housing 85. The protection portion 70a includes a second surface 70b (first opposed portion) and a third surface 70c (second opposed portion) that cover a surface of each control circuit board 75 fixed to the side wall of the housing 85. The control circuit board 75 is covered by the second surface 70b and the third surface 70c of the protection portion 70a, and hence fluctuation in the variable volume 72 due to contact of a hand and cloth of an operator is not caused, which can solve a problem in that previously-adjusted value is changed. Note that, the second surface 70b and the third surface 70c do not need to cover an entire part of the control circuit board 75, and only needs to cover at least a part of the control circuit board 75.

The third surface 70c of the protection portion 70a protrudes from the second surface 70b away from the control circuit board 75 with respect to the second surface 70b. That is, a stepped portion 70h (stepped surface) serving as a connecting portion is formed between the second surface 70b and the third surface 70c.

The cover member 70 is put on the housing 85 in a direction indicated by the arrow F of FIG. 2C, and the cover engaging portions 88 of the cover member 70 and the housing engaging portions 87 of the housing 85 are engaged with each other. Thus, the light scanning apparatus 40 is constructed as illustrated in FIG. 2E.

State when Transporting Cover Member

Figure 3A:
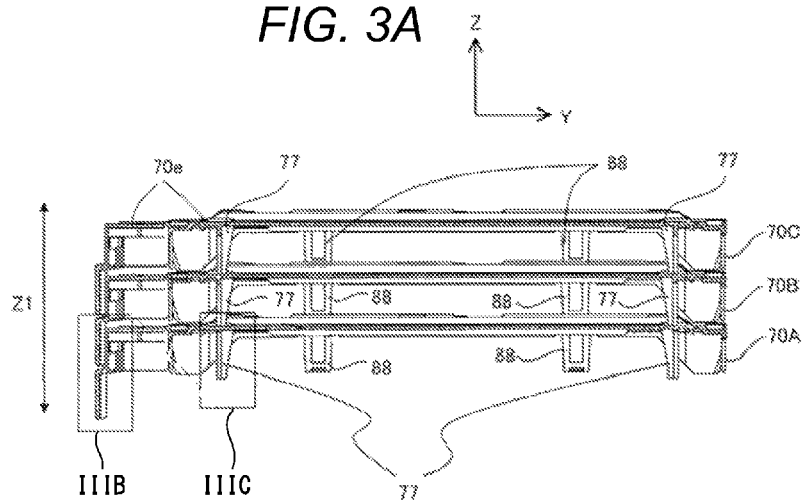
FIG. 3A is a cross-sectional view of a plurality of stacked cover members according to the first embodiment.
Figure 3B:
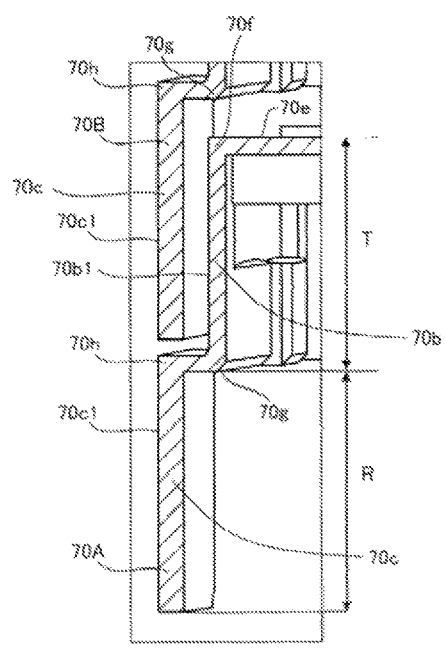
FIG. 3B is an enlarged cross-sectional view of a framed rectangle area IIIB in FIG. 3A.
Figure 3C:
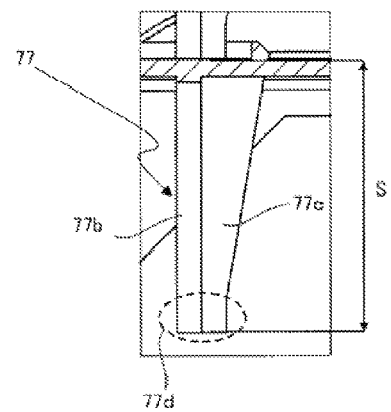
FIG. 3C is an enlarged cross-sectional view of a framed rectangle area IIIC in FIG. 3A.

FIG. 3A is a cross-sectional view of a plurality of stacked cover members 70 according to the embodiment, and illustrates a stacked state of three cover members 70 (corresponding to a cover member 70A, a cover member 70B, and a cover member 70C from the bottom) in the embodiment. FIG. 3B is an enlarged cross-sectional view of a framed rectangle area IIIB in FIG. 3A, and illustrates a vicinity of the protection portions 70a of the cover members 70. FIG. 3C is an enlarged cross-sectional view of a framed rectangle area IIIC in FIG. 3A, and illustrates a vicinity of one of the protruding portions 77 of the cover member 70. Note that, in FIG. 3A, FIG. 3B, and FIG. 3C, a cross-section of the cover member 70 is illustrated in a hatched pattern.

The plurality of cover members 70 are superposed and stacked in an up-and-down direction (Z-axis direction), and are transported. Further, at the time of assembly of the light scanning apparatus 40, the cover members 70 in the stacked state are supplied to an assembly operation performed by an operator.

As illustrated in FIG. 3A, in a case of stacking the cover members 70, the protection portions 70a of the cover members 70 overlap with each other. Specifically, for example, in a direction (Y-axis direction) perpendicular to a mounting surface of the control circuit board 75, the second surface 70b of the protection portion 70a of the cover member 70A overlaps with the third surface 70c of the cover member 70B stacked directly on the cover member 70A. The stepped portion 70h is formed between the second surface 70b and the third surface 70c. Thus, the plurality of cover members can be stacked on each other, and space saving can be realized at the time of transportation of the cover members 70. Note that, a related-art cover member does not have such a part as illustrated in FIG. 3B that a lower cover member overlaps with an upper cover member, and hence the upper cover member 70 can only be stacked on the base surface 70e of the lower cover member 70. Accordingly, the number of the cover members 70 to be stacked is limited when stacking the plurality of cover members, and the cover members 70 assume an unstable state even if stacked. However, the cover members 70 according to the embodiment enable stacking of many cover members in a stable state.

Further, regarding the protection portion 70a of the cover member 70 according to the embodiment, a surface 70c1 of the third surface 70c is more distant from the control circuit board 75 than a surface 70b1 of the second surface 70b. Accordingly, even when the cover bends or partially warps due to molding, it is possible to solve a problem in that a distal end of the protection portion 70a, i.e., a distal end of the surface 70c1 of the third surface 70c hits an electrical component on the control circuit board 75 and thus applies a large force to the electrical component. Here, the surface 70b1 of the second surface 70b is nearer to the control circuit board 75 than the surface 70c1 of the third surface 70c. The surface 70b1 of the second surface 70b is near to a first bending portion 70f bending from the base surface 70e, and hence can be increased in rigidity. Even when the same force is applied, the surface 70b1 warps to a smaller extent than the distal end portion of the protection portion 70a, and thus it is possible to prevent contact of the protection portion 70a with the control circuit board 75.

Configurations of Stacking Protruding Portion and Receiving Portion

The cover members 70 include the stacking protruding portions 77 that are brought into contact with each other when stacking the plurality of cover members on each other. That is, in a case where the cover member 70B is stacked on another cover member 70A, the stacking protruding portions 77 of the cover member 70B are brought into contact with the receiving portions 77a of the cover member 70A. The stacking protruding portions 77 extend substantially vertically toward the housing 85 (that is, downward in the Z-axis direction) from the surface of the cover member 70 opposed to the housing 85. In addition, a length (distance S described below) of the stacking protruding portions 77 from the base surface 70e in the Z-axis direction is longer than a length of the cover engaging portions 88 from the base surface 70e in the Z-axis direction. That is, the length of each of the cover engaging portions 88 extending from the base surface 70e in the Z-axis direction is shorter than the length of each of the stacking protruding portions 77 extending from the base surface 70e in the Z-axis direction. This can prevent breakage of the cover engaging portions 88 when stacking the plurality of cover members 70.

Note that, a shape of the stacking protruding portion 77 is not particularly limited. As illustrated in FIG. 2C, the stacking protruding portion 77 according to the embodiment has a trapezoid shape when viewed from the Y-axis direction, and a length of the stacking protruding portion 77 in the X-axis direction is decreased downward in the Z-axis direction. Further, when a trapezoid part of the stacking protruding portion 77 is referred to as a protruding-portion main portion 77b, as illustrated in FIG. 3C, a rib portion 77c is formed for maintaining rigidity of the protruding-portion main portion 77b, and the rib portion 77c has a shape tapered toward the housing 85 (tapered shape). Accordingly, the stacking protruding portion 77 has, as an entire shape, a tapered part tapered downward in the Z-axis direction. Further, a cross-sectional shape of the protruding-portion main portion 77b and the rib portion 77c taken on the plane parallel to an XY plane is a substantially T-shape. That is, the stacking protruding portion 77 has such a shape that the area of the substantially T-shape, which corresponds to a cross-section of the tapered part of the stacking protruding portion 77 taken on the plane parallel to the XY plane, is decreased downward in the Z-axis direction.

Meanwhile, a distal end portion 77d (a portion enclosed by an ellipse indicated by the broken line in FIG. 3C) of the stacking protruding portion 77 is brought into contact with the receiving portion 77a of the lower cover member 70, and the distal end portion 77d does not have a tapered shape. That is, the area of the substantially T-shape in the distal end portion 77d of the stacking protruding portion 77 is maintained constant downward in the Z-axis direction. With this configuration, in a case of stacking one cover member 70 on another cover member 70, for example, in a case of stacking the cover member 70B on the cover member 70A, the stacking protruding portion 77 of the cover member 70B does not climb over the receiving portion 70a of the cover member 70A. This prevents deterioration of stability when stacking the cover members 70.

The receiving portion 77a of the cover member 70 is formed on the base surface 70e of the cover member 70 at a position at which the stacking protruding portion 77 of the cover member 70 to be stacked above is brought into contact with the receiving portion 77a. As illustrated in FIG. 2E, a frame 77ab is formed to surround the receiving portion 77a of the cover member 70. The frame 77ab is formed in such a manner that only edge portions of the receiving portion 77a are ridged so as to surround a range wider than a range within a shape of the bottom surface of the stacking protruding portion 77 is put in. The distal end portion 77d of the stacking protruding portion 77 of the cover member 70B stacked on the cover member 70A is caught by the frame 77ab of the receiving portion 77a of the cover member 70A, and thus the cover member 70B does not slip over the base surface 70e of the cover member 70A. Note that, as described above, the shape of the stacking protruding portion 77 is not limited to the above-mentioned configuration, and any shape may be adopted as long as it satisfies a relation in length described below.

At least three stacking protruding portions 77 are provided for each cover member 70, and the stacking protruding portions 77 are formed so as to stabilize the cover members 70 in a case of stacking the cover members 70. Note that, four stacking protruding portions 77 are formed in the embodiment. The stacking protruding portions 77 are formed so as not to be brought into contact with various components in the housing 85, and not to interfere the optical paths of the light beam when the cover member 70 is attached to the housing 85.

Relation Among First Surface, Second Surface, and Stacking Protruding Portion

When stacking the cover members 70, in a stacking direction (direction indicated by the arrow Z1 in FIG. 3A (Z-axis direction)), the surface 70b1 of the second surface 70b, the surface 70c1 of the third surface 70c, and the stacking protruding portion 77 are constructed so as to satisfy the following relation. Note that, reference symbols S, T, and R described below are illustrated in FIG. 3B and FIG. 3C.

$$S > T \geq R.$$

S: a distance from the base surface 70e to the distal end of the stacking protruding portion 77 in the direction indicated by the arrow Z1

T: a distance from the base surface 70e to the distal end of the surface 70b1 of the second surface 70b in the direction indicated by the arrow Z1

R: a distance from a second bending portion 70g to the distal end of the surface 70c1 of the third surface 70c in the direction indicated by the arrow Z1

Here, the distal end of the surface 70b1 of the second surface 70b may be construed as the second bending portion 70g serving as the connecting portion. Further, the second bending portion 70g in the distance R may be construed as a third bending portion 70h. Note that, a thickness of the cover member 70 is smaller than the distance S, T, or R.

When the distances S, T, and R satisfy the above-mentioned relation, the following may be said. First, in a case where a relation of S>T is satisfied, even when the cover member 70B is stacked on the cover member 70A, the stacking protruding portion 77 of the cover member 70B is longer in length in Z-axis direction than the surface 70b1 of the second surface 70b of the protection portion 70a. Accordingly, the second bending portion 70g of the cover member 70B is not brought into contact with the base surface 70e of the cover member 70A. In addition, in a case where a relation of T≥R is satisfied in this state, a length of the surface 70c1 of the third surface 70c of the cover member 70B is equal to or shorter than a length of the surface 70b1 of the second surface 70b of the cover member 70A. Accordingly, the distal end of the surface 70c1 of the third surface 70c of the cover member 70B is not brought into contact with the third bending portion 70h of the protection portion 70a of the cover member 70A. With this configuration, when stacking the plurality of cover members 70 at the time of transportation or at a site of assembling the light scanning apparatus 40, it is possible to prevent deformation and breakage caused by contact between the protection portions 70a. In a height direction (Z-axis direction) when stacking the plurality of cover members 70, an overlapping amount of the cover members 70 can be increased. This can reduce an entire height when stacking the plurality of cover members 70, and can reduce an occupied space when stacking the plurality of cover members.

Further, in the embodiment, the cover engaging portions 88, which are formed for fixing the cover member 70 to the housing 85, are set to be smaller in height than the stacking protruding portions 77. The length of each of the cover engaging portions 88 in the Z-axis direction is shorter than the length (distance S) of each of the stacking protruding portions 77, and thus it is possible to solve a problem in that, when stacking the plurality of cover members, the cover engaging portions 88 are brought into contact with the lower cover member 70 and break due to the contact.

Note that, in the embodiment, a two-tier configuration is adopted as a stepped configuration. However, the stepped configuration is formed in three tiers, four tiers, or the like, that is, at least two or more stepped surfaces are provided away from a board surface of the control circuit board 75, and thus the above-mentioned effects can be obtained. In this case, it is desired that all stepped surfaces have the same height (T=R in the case of FIGS. 3A to 3C) or a stepped surface disposed in a higher position in a direction indicated by the arrow Z1 has a longer height (T>R in the case of FIGS. 3A to 3C). For example, in a case where the protection portion 70a of the cover member 70 has n stepped surfaces (n is a positive integer equal to or longer than two), it is only necessary to satisfy the following relation.

$$S > T1 \geq T2 \ldots \geq Tn$$

Here, S represents the length of the stacking protruding portion 77 in the Z-axis direction as described above. T1 represents a length of a first surface in a direction (Z-axis direction) perpendicular to the surface of the cover member 70 opposed to the housing 85. The first surface refers to a stepped surface that is nearest, in at least two stepped surfaces, to the surface of the cover member 70 opposed to the housing 85. T2 represents a length of a second surface in the direction (Z-axis direction) perpendicular to the surface of the cover member 70 opposed to the housing 85. The second surface refers to a subsequent stepped surface continuous with the first surface. Tn represents a length of an nth surface in the direction (Z-axis direction) perpendicular to the surface of the cover member 70 opposed to the housing 85. The nth surface refers to a subsequent stepped surface continuous with an (n−1)th surface. As described above, also in a case of stacking the plurality of cover members 70 each having n stepped surfaces, when the above-mentioned relation is satisfied, the same effects as those described above can be obtained.

As described above, according to the embodiment, it is possible to increase transport efficiency while preventing deformation and breakage of the cover member.

Second Embodiment

Figure 4A:
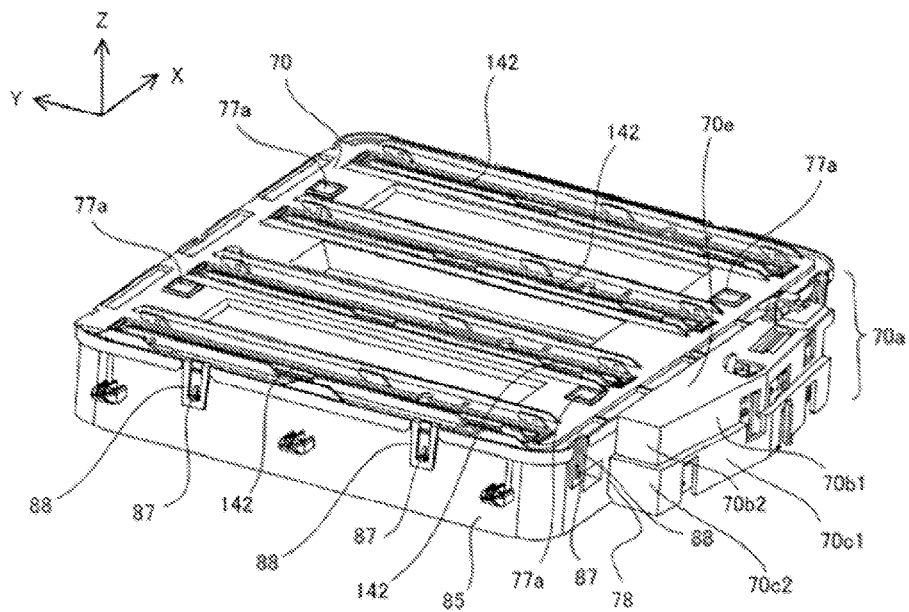
FIG. 4A is a perspective view of a light scanning apparatus according to the second embodiment.
Figure 4B:
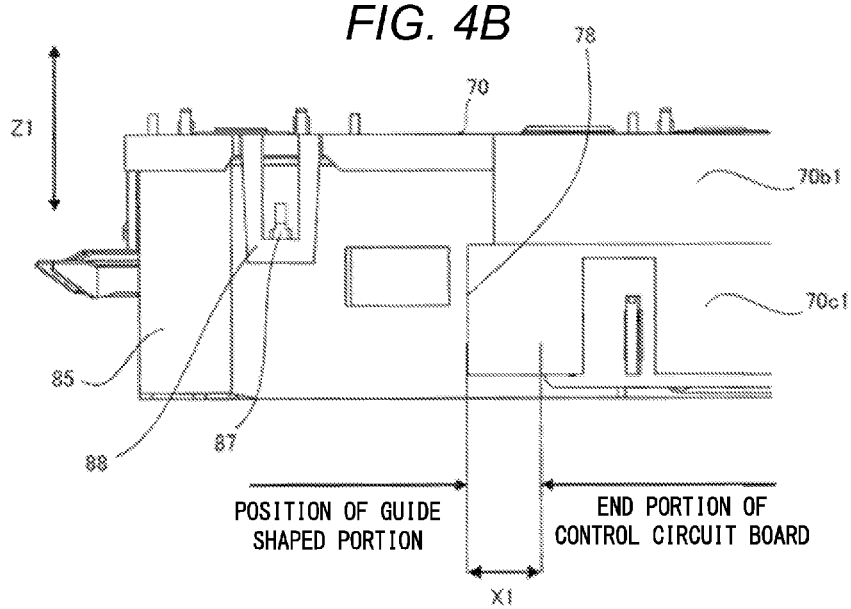
FIG. 4B is a diagram of the light scanning apparatus according to the second embodiment viewed from a side of a control circuit board.

FIG. 4A is a perspective view of a light scanning apparatus according to a second embodiment. FIG. 4B is a diagram of the light scanning apparatus according to the second embodiment viewed from a side of a control circuit board. Note that, the same components as those of the first embodiment are denoted by the same reference symbols, and description thereof is omitted.

In a part of a cover member 70 according to the embodiment, a guide shaped portion 78 is formed. The guide shaped portion 78 prevents a protection portion 70a itself from being brought into contact with an electrical component of a control circuit board 75 when the cover member 70 is attached to the housing 85. The guide shaped portion 78 is arranged at a distance X1 from an end portion of the control circuit board 75 in a direction (X-axis direction) perpendicular to a direction of attaching the cover member 70 (direction indicated by the arrow Z1 (Z-axis direction)). The guide shaped portion 78 is formed by providing a surface 70c2 (surface parallel to the YZ plane) perpendicular to a surface 70c1 of a third surface 70c. Note that, above the surface 70c2 in a vertical direction (Z-axis direction), a surface 70b2 substantially perpendicular to a surface 70b1 of a second surface 70b is provided. As in the case where the surface 70b1 of the second surface 70b and the surface 70c1 of the third surface 70c form the stepped structure by a second bending portion 70g and a third bending portion 70h, the surface 70b2 and the surface 70c2 also form the stepped structure. With this structure, similarly to the first embodiment, the plurality of cover members 70 can be stacked.

Note that, in a case where the protection portion 70a is formed by providing at least three stepped surfaces, a surface perpendicular to the stepped surface farthest from the board surface of the control circuit board 75 is formed as the guide shaped portion 78. From a base surface 70e of the cover member 70 toward the guide shaped portion 78, the surface 70b2, the surface 70c2, . . . are formed as stepped surfaces. With this configuration, space saving and stability can be maintained when stacking the plurality of cover members 70.

With this configuration, in a case where the cover member 70 is attached to the housing 85, before the protection portion 70a is brought into contact with the electrical component mounted on the control circuit board 75, the guide shaped portion 78 and the housing 85 are brought into contact with each other. A description will be provided of, for example, a case of keeping attaching the cover member 70 on the housing 85 in a state in which the cover member 70 is displaced in the Y-axis direction when the cover member 70 is attached to the housing 85. In a case where the cover member 70 includes no guide shaped portion 78, when the cover member 70 is moved downward in the Z-axis direction while the cover member 70 is displaced in the Y-axis direction, the distal end of the protection portion 70a is brought into contact with the control circuit board 75. However, in a case where the cover member 70 includes the guide shaped portion 78, even when the cover member 70 is moved downward in the Z-axis direction while the cover member 70 is displaced in the Y-axis direction, the guide shaped portion 78 is brought into contact with the housing 85 before the distal end of the protection portion 70a is brought into contact with the control circuit board 75. Accordingly, when the cover member 70 is attached to the housing 85, the cover member itself is reliably attached without contact with the control circuit board 75, and thus it is possible to prevent breakage of the electrical component caused by contact of the cover member 70 with the control circuit board 75.

As described above, according to the embodiment, it is possible to increase transport efficiency while preventing deformation and breakage of the cover member.

Third Embodiment

Figure 5:
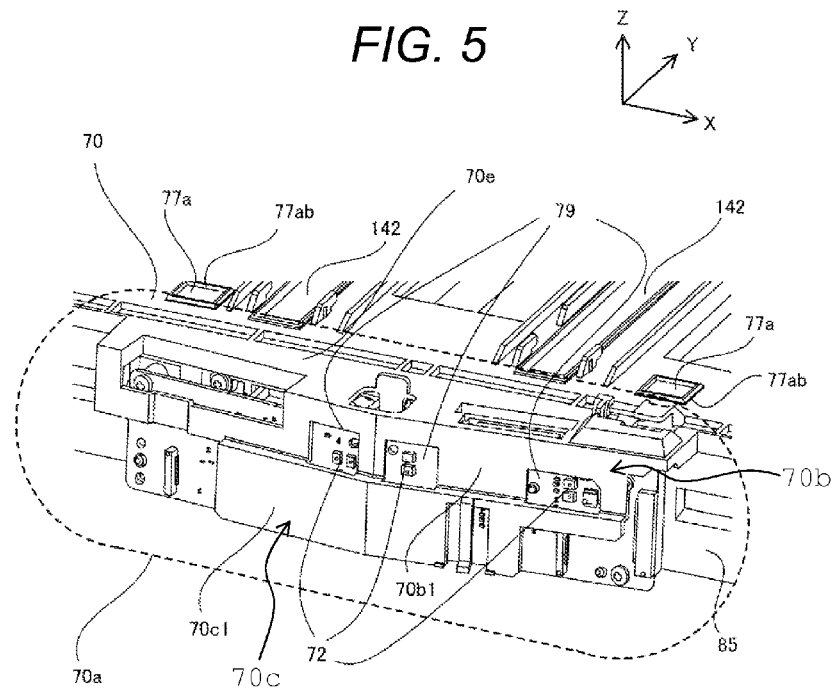
FIG. 5 is a diagram illustrating a configuration of a cover member according to the third embodiment.

FIG. 5 is a schematic configuration diagram illustrating a configuration according to a third embodiment of the present invention, and a perspective view looking from a side on which a control circuit board 75 is fixed to the housing 85. Note that, the same components as those of the first embodiment are denoted by the same reference symbols, and description thereof is omitted.

In a surface 70b1 of a second surface 70b of a protection portion 70a (encircled by the broken line), at positions allowing access to variable volumes 72 serving as adjusting members, opening portions (holes) 79 are formed in the surface 70b1 of the second surface 70b. With this configuration, the opening portions 79 are formed at positions corresponding to the variable volumes 72, and the protection portion 70a, specifically, the surface 70b1 of the second surface 70b and a surface 70c1 of a third surface 70c are present in vicinities of the variable volumes 72 with a space from the control circuit board 75. Accordingly, in a state in which a cover member 70 is attached to the housing 85, access to the variable volumes 72 can be made to adjust a light intensity. In addition, contact of a hand and cloth of an operator with the variable volumes 72 can be prevented.

Further, the variable volumes 72 and the opening portions 79 are provided in the surface 70b1 of the second surface 70b.

Meanwhile, the surface 70c1 of the third surface 70c protrudes outward compared with the surface 70b1 of the second surface 70b, that is, the surface 70c1 of the third surface 70c is distant from the control circuit board 75. Accordingly, unintentional contact with the variable volumes 72 can be prevented.

Here, in a case where the protection portion 70a of the cover member 70 has a plurality of steps, it is desired that the opening portions 79 be formed in a surface except a surface farthest from a board surface serving as a surface on which the control circuit board 75 is fixed. In the case of FIG. 5, the opening portions 79 are formed not in the surface 70c1 of the third surface 70c but in the surface 70b1 of the second surface 70b. This reason is as follows. That is, when the opening portions 79 are formed in the surface farthest from the control circuit board 75 among a plurality of stepped surfaces, the openings are formed in positions close to a distal end of the protection portion 70a. When the openings are formed in the positions close to the distal end of the protection portion 70a, rigidity of the cover member 70 is locally reduced, which may cause deformation of the cover member 70. Accordingly, in a case where a plurality of stepped surfaces are provided, the opening portions 79 are formed in a stepped surface except a stepped surface farthest from the board surface of the control circuit board 75. Note that, the third embodiment may be applied to the configuration according to the second embodiment, which has the guide shaped portion 78. A volume adjusting tool for the variable volumes 72 normally has a size of approximately 7 mm (millimeters), and hence it is desired that the opening portions 79 have a size of approximately 7 mm to 10 mm in consideration of workability. This can facilitate adjusting operation, and can prevent contact of a hand of an operator except for the adjusting operation.

As described above, in a case where each variable volume 72 is provided at a position on the control circuit board 75 opposed to the second surface 70b (specifically, an opposite surface of the surface 70b1), each opening portion 79 is formed at a position on the second surface 70b opposed to the variable volume 72. Note that, in the embodiment, among four variable volumes 72 (refer to FIG. 2D) provided on the control circuit board 75, three variable volumes 72 are provided at positions opposed to the second surface 70b. Accordingly, the embodiment adopts a configuration in which three opening portions 79 are formed in the second surface 70b. Note that, in the embodiment, the three opening portions 79 are formed so as to respectively correspond to the three variable volumes 72 at the positions opposed to the second surface 70b. However, a configuration having at least one opening portion 79 may be adopted.

Further, as illustrated in FIG. 2D, one of the four variable volumes 72 provided on the control circuit board 75 is provided at a position on the control circuit board 75 opposed to the third surface 70c. In this case, for the above-mentioned reason, priority is placed on prevention of reduction in rigidity of the cover member 70, and hence the opening portion 79 is not formed in the third surface 70c (refer to FIG. 5). However, in a case where rigidity of the cover member 70 is not reduced even when the opening portion 79 is formed in the third surface 70c, the opening portion 79 may be formed in the third surface 70c. Further, the opening portion 79 may be formed across the second surface 70b, the third surface 70c, and the stepped portion ranging from a second bending portion 70g to a third bending portion 70h.

As described above, according to the embodiment, it is possible to increase transport efficiency while preventing deformation and breakage of the cover member. In addition, according to the embodiment, it is possible to finely adjust the light intensity in a state of protecting a mounting surface of the control circuit board 75.

Note that, according to the first to third embodiments, the cover member 70 is fixed to the housing 85 by the cover engaging portions 88, but the same effects can be obtained even when the cover member 70 is fixed to the housing 85 by a fixing method such as screw fixation. Further, the light scanning apparatus using the cover member described in the first to third embodiments is not limited to the above-mentioned light scanning apparatus. The present invention is also applicable to a light scanning apparatus having a configuration in which the housing has an opening and the opening is covered by the cover member. In addition, the present invention is not limited to the image forming apparatus illustrated in FIG. 1, and is applicable to an image forming apparatus including the light scanning apparatus using the cover member.

Fourth Embodiment

With reference to FIGS. 7A and 7B to FIGS. 10A and 10B, a fourth embodiment of the present invention will be described. Descriptions of components each having the same function as in the first to third embodiments are omitted.

Figure 7A:
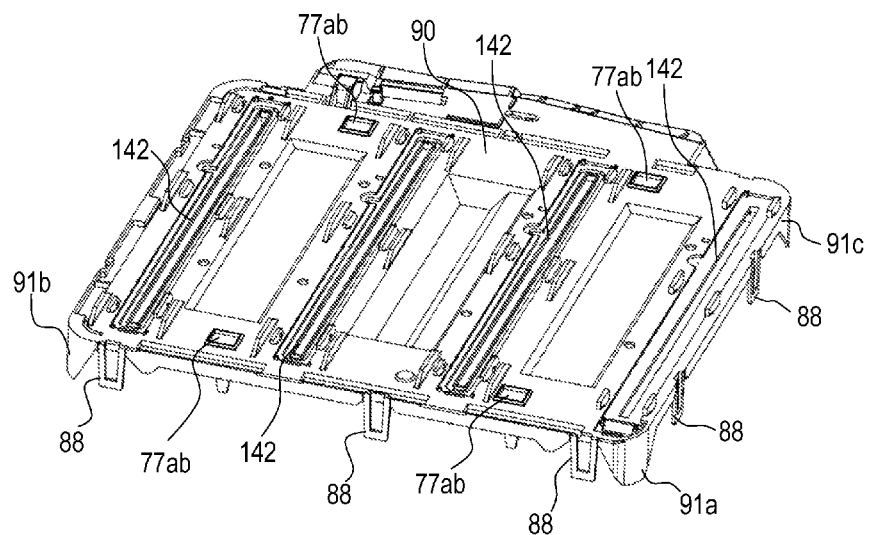
FIG. 7A and FIG. 7B are perspective views of a cover member according to a fourth embodiment.
Figure 7B:
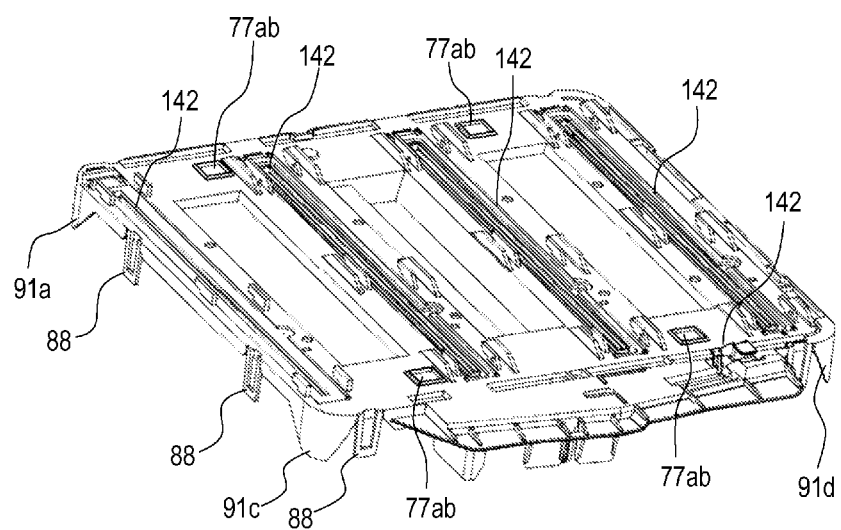

FIG. 7A and FIG. 7B are perspective views of a cover member 90 of the embodiment. Unlike the cover member 70 of the first to third embodiments, the cover member 90 of the embodiment has no protection portion 70a and includes protection protruding portions 91a, 91b, 91c, and 91d at four corners of the cover member 90, the protection protruding portions 91a to 91d each having a length longer than that of cover engaging portions 88. An opening defined by a side wall of a housing 85 of the embodiment has a substantially rectangular shape. For that reason, as illustrated in FIG. 7A, the cover member 90 configured to close the opening also has a substantially rectangular shape. The protection protruding portions 91a to 91d are provided to stand on the four corners (four vertices of an outer shape of the cover member 90) of the cover member 90 having the substantially rectangular shape.

Figure 8A:
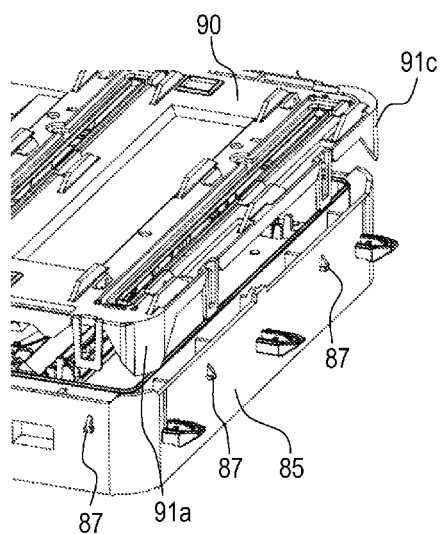
FIG. 8A, FIG. 8B, FIG. 8C, and FIG. 8D illustrate the cover member to be attached to a housing.
Figure 8B:
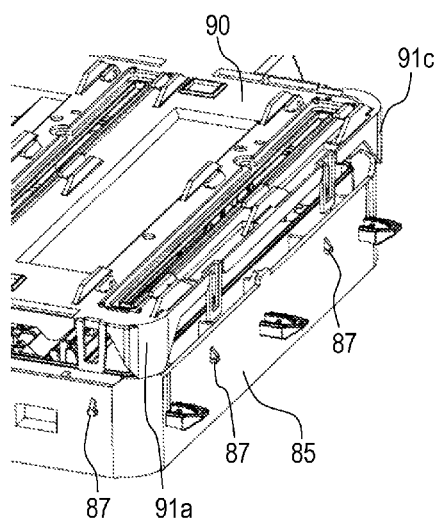
Figure 8C:
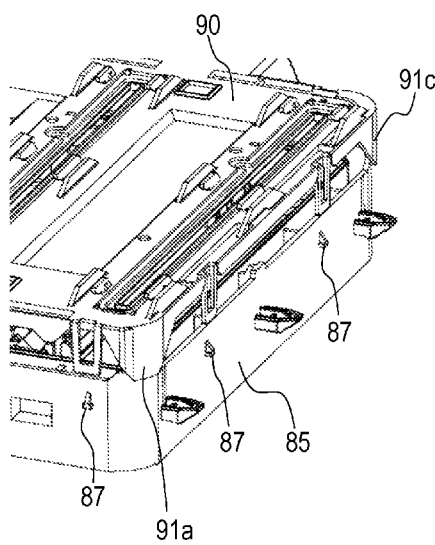
Figure 8D:
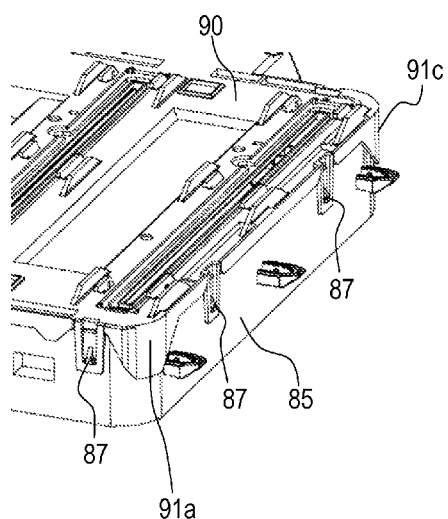

As illustrated in FIG. 8A and FIG. 8B, when the cover member 90 is to be moved to a housing 85 in order to fix the cover member 90 to the housing 85, the protection protruding portions 91a to 91d first overlap with (are opposed to) the side wall of the housing 85 before the cover engaging portions 88 overlap with the side wall on the outer side of the housing 85 (Reference is made to FIG. 8B.). Specifically, the length of the protection protruding portions 91a to 91d is longer than that of the cover engaging portions 88 in a direction perpendicular to the closing surface of the cover member 90. When the distal end portions 32 of the protection protruding portions 91a to 91d are caused to move along the side wall of the housing 85, the protection protruding portions 91a to 91d are configured to serve as guide members defining a relative movement direction between the cover member 90 and the housing 85. That is, when the distal end portions 32 of the protection protruding portions 91a to 91d are moved along the side wall of the housing 85, a gap formed between the protection protruding portions 91a to 91d and the housing 85 is 1 mm or less. Therefore, if the cover member 90 is to be moved in a direction parallel to the closing surface of the cover member 90, the protection protruding portions 91a to 91d are brought into contact with the side wall of the housing 85, with the result that the relative movement of the cover member 90 and the housing 85 in the direction parallel to the closing surface of the cover member 90 is restricted (Reference is made to FIG. 8C.).

The protection protruding portions 91a to 91d having the length longer than that of the cover engaging portions 88 prevent, when the cover member 90 is to be attached to the housing 85, the cover engaging portions 88 from abutting against the top of the side wall of the housing 85 so that the deformation of the cover engaging portions 88 can be avoided. In addition, the protection protruding portions 91a to 91 restrict the relative movement between the cover member 90 and the housing 85 in the direction parallel to the closing surface of the cover member 90, thereby being capable of suppressing the deformation of the cover engaging portions 88, which is caused by the contact between the cover engaging portions and the side wall when the cover member 90 is to be attached to the housing 85.

Figure 9A:
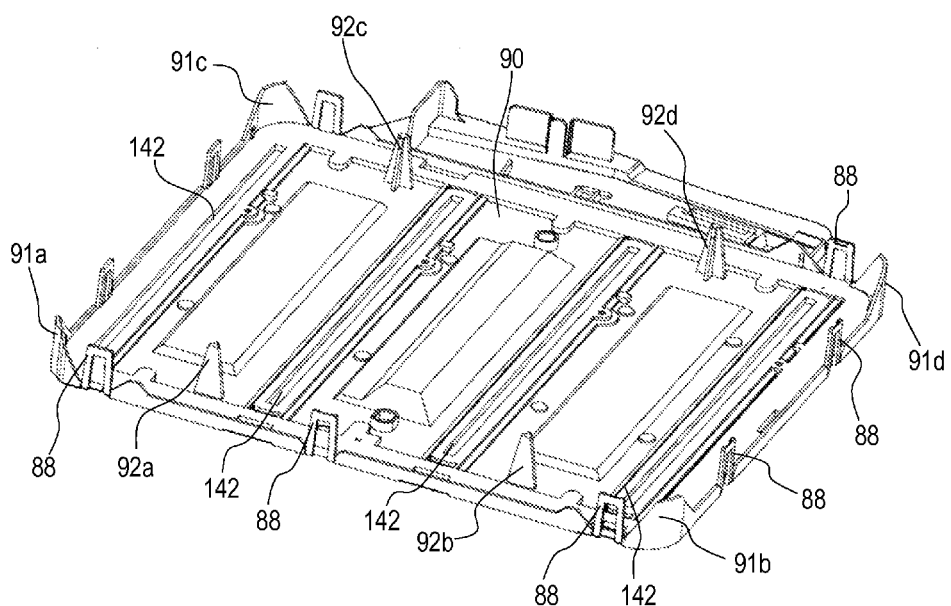
FIG. 9A is a perspective view illustrating a backside of the cover member illustrated in FIG. 7A.
Figure 9B:
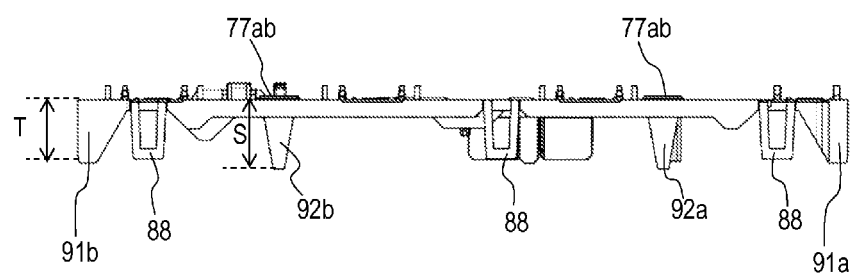
FIG. 9B is a diagram of the cover member looking from a lateral view.
Figure 10A:
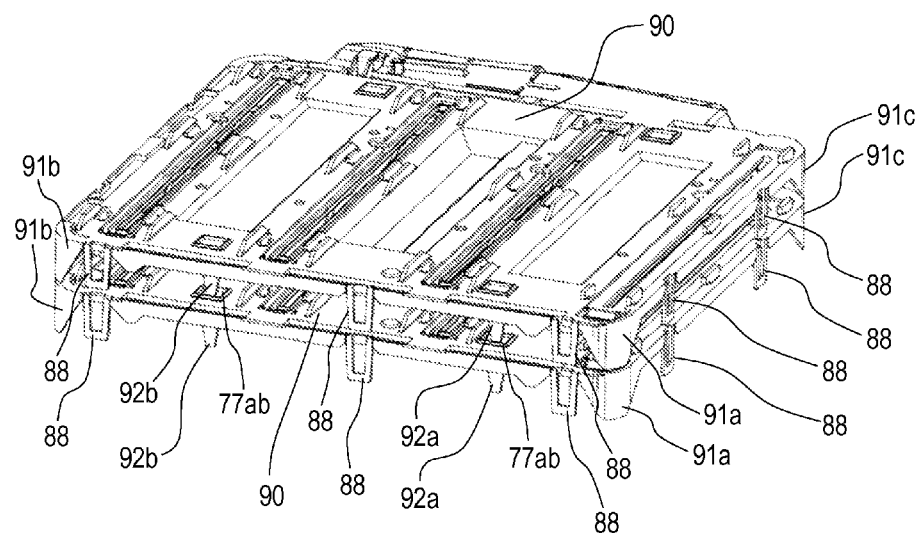
FIG. 10A and FIG. 10B are perspective views of a plurality of stacked cover members.
Figure 10B:
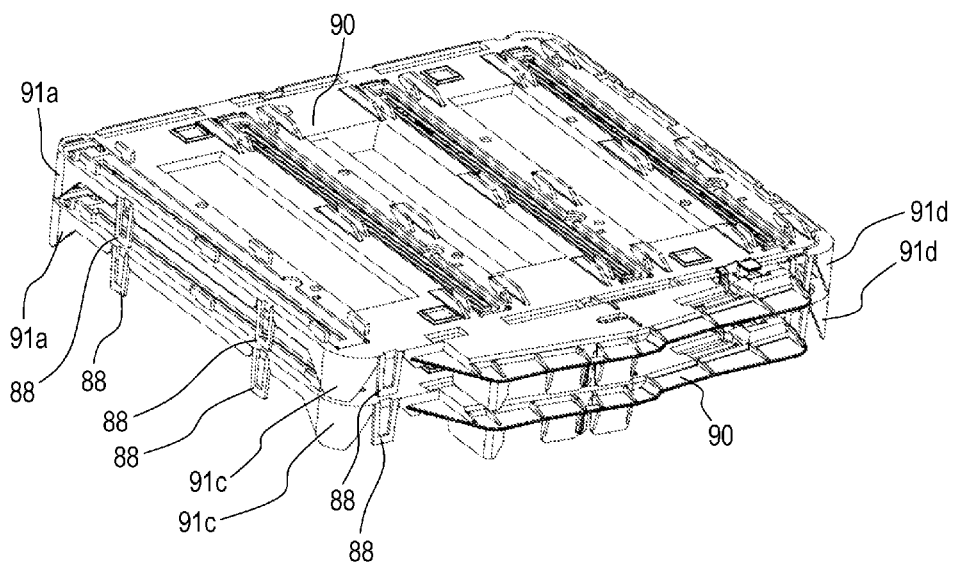

FIG. 9A is a perspective view illustrating the backside of the cover member 90 illustrated in FIGS. 7A and 7B. FIG. 9B is a diagram of the cover member 90 looking from a lateral view. As illustrated in FIG. 9A, the cover member 90 is provided with stacking protruding portions 92a, 92b, 92c, and 92d. The stacking protruding portions 92a to 92d have the same function of the stacking protruding portions 77 as illustrated in the first to third embodiments. As illustrated in FIG. 9B, the length of the stacking protruding portions 92a to 92d is longer than that of the protection protruding portions 91a to 91d (S>T). In this way, due to the fact that the length of the stacking protruding portions 92a to 92d is longer than that of the protection protruding portions 91a to 91d, as illustrated in FIGS. 10A and 10B, a plurality of the cover members 90 may be stably stacked by the stacking protruding portions 92a to 92d. In a state as illustrated in FIGS. 10A and 10B, the protection protruding portions 91a to 91d and the cover engaging portions 88 of an upper cover member 90 are not in contact with a lower cover member 90.

As described above, the length of the protection protruding portions 91a to 91d is made longer than that of the cover engaging portions 88 and that of the stacking protruding portions 92a to 92d, thereby being capable of stably stacking the plurality of the cover members 90.

Note that, in the embodiment, the description is made of the cover member 90 including the protection protruding portions 91a to 91d. However, the protection protruding portions 91a to 91d may not necessarily be provided on the cove member 90. In this configuration, when the length of the stacking protruding portions 92a to 92d is longer than that of the cover engaging portions 88, the plurality of the cover members 90 can be stably stacked without bringing the cover engaging portions 88 of an upper cover member 90 into contact with a lower cover member 90.

Further, in the embodiment, there are exemplified four stacking protruding portions 91a to 91d. However, the stacking protruding portions may be arranged so that the plurality of the cover members may be stably stacked. Consequently, depending on the shape of the cover and the arrangement of the stacking protruding portions, at least three stacking protruding portions are required. The same is true in the first to third embodiments.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-131657, filed Jun. 24, 2013, and Japanese Patent Application No. 2014-122592, filed Jun. 13, 2014, which are hereby incorporated by reference herein in their entirety.

What is claimed is:

1. A cover member to be attached to a housing including a bottom portion on which a rotary polygon mirror is mounted and a side wall provided to stand on the bottom portion, the cover member comprising:
    a closing surface configured to close an opening surrounded by the side wall, the rotary polygon mirror being passed through the opening when the rotary polygon mirror is to be mounted on the bottom portion;
    at least three protruding portions protruding from the closing surface so as to be located on an inside of the housing in a state in which the cover member is attached to the housing; and
    a protection portion configured to protect a circuit board fixed to the side wall of the housing, the protection portion having:
    a first opposed portion opposed to the circuit board and provided to stand on the closing surface;
    a second opposed portion opposed to the circuit board and protruding with respect to the first opposed portion away from the circuit board; and
    a connecting portion configured to connect the first opposed portion and the second opposed portion,
    wherein a length S of the at least three protruding portions from the closing surface in a direction perpendicular to the closing surface and a length T of the first opposed portion in the direction perpendicular to the closing surface satisfy a relation of S>T.

2. A cover member according to claim 1, further comprising a cover engaging portion provided to stand on the closing surface along an outer side of the side wall of the housing to be engaged with a housing engaging portion provided on the outer side of the side wall of the housing,
    wherein the cover member is attached to the housing by the cover engaging portion being engaged with the housing engaging portion, and
    wherein a length of the cover engaging portion in the direction perpendicular to the closing surface is shorter than the length of the at least three protruding portions in the direction perpendicular to the closing surface.

3. A cover member according to claim 1, wherein each of the at least three protruding portions has a distal end portion of which an area in a cross-section parallel to a plane opposed to the housing is maintained constant in the direction perpendicular to the closing surface.

4. A cover member according to claim 1, wherein the closing surface is provided with receiving portions configured to receive protruding portions of another cover member having the same shape as the cover member, the receiving portions being provided on a backside opposed to a surface of the closing surface on which the at least three protruding portions are provided.

5. A cover member according to claim 4, wherein each of the receiving portions has a ridged frame.

6. A cover member according to claim 1, wherein, when a plurality of cover members are stacked on top of each other, a cover engaging portion of an upper cover member is out of contact with a lower cover member and the upper cover member is placed on the lower cover member by the at least three protruding portions of the upper cover member.

7. A light scanning apparatus, comprising:
    a light source configured to emit a light beam;
    a rotary polygon mirror configured to deflect the light beam to cause the light beam emitted from the light source to scan a photosensitive member in a scanning direction;

an optical member configured to guide the light beam deflected by the rotary polygon mirror to the photosensitive member;

a housing configured to contain the light source, the rotary polygon mirror, and the optical member; and a cover member as recited in claim 1.

8. A light scanning apparatus according to claim 7, wherein the at least three protruding portions are located without blocking an optical path of the light beam in the housing.

9. An image forming apparatus, comprising:

a photosensitive member;

a light scanning apparatus as recited in claim 7, the light scanning apparatus emitting a light beam to the photosensitive member to form an electrostatic latent image;

a developing unit configured to develop the electrostatic latent image formed by the light scanning apparatus to form a toner image; and a transfer unit configured to transfer the toner image formed by the developing unit onto a recording medium.

10. A cover member to be attached to a light scanning apparatus including: a housing having a bottom portion on which a rotary polygon mirror is mounted and a side wall provided to stand on the bottom portion; and housing engaging portions provided in a plurality of positions on an outside of the side wall of the housing, the cover member comprising:

a closing surface configured to close an opening surrounded by the side wall, the rotary polygon mirror being passed through the opening when the rotary polygon mirror is to be mounted on the bottom portion;

cover engaging portions paired up with the housing engaging portions, respectively, and provided to stand in a plurality of positions on the closing surface of the cover member so that the cover engaging portions are opposed to the side wall provided with the housing engaging portions and engaged with the housing engaging portions paired up, respectively, in a state in which the cover member is attached to the housing; and at least three protruding portions protruding from the closing surface so as to be located on an inside of the housing in a state in which the cover member is attached to the housing, wherein a length of the at least three protruding portions is longer than a length of the cover engaging portions in a direction perpendicular to the closing surface.

11. A cover member according to claim 10, wherein, when a plurality of cover members are stacked on top of each other, cover engaging portions of an upper cover member are out of contact with a lower cover member and the upper cover member is placed on the lower cover member by the at least three protruding portions of the upper cover member.

12. A cover member according to claim 10, wherein each of the at least three protruding portions has a distal end portion of which an area in a cross-section parallel to a plane opposed to the housing is maintained constant in the direction perpendicular to the closing surface.

13. A cover member according to claim 10, wherein the closing surface is provided with receiving portions configured to receive protruding portions of another cover member having the same shape as the cover member, the receiving portions being provided on a backside opposed to a surface of the closing surface on which the at least three protruding portions are provided.

14. A cover member according to claim 10, wherein each of the receiving portions has a ridged frame.

15. A cover member according to claim 10, further comprising a plurality of protection protruding portions provided to stand on the closing surface of the cover member so as to be opposed to the side wall in the state in which the cover member is attached to the housing, wherein a length of the plurality of the protection protruding portions is longer than the length of the cover engaging portions, and wherein the length of the at least three protruding portions is longer than the length of the plurality of the protection protruding portions in the direction perpendicular to the closing surface.

16. A cover member according to claim 10, wherein the plurality of the protection protruding portions and the cover engaging portions are provided to stand on the closing surface of the cover member so that, when the cover member is to be attached to the housing, a distal end of at least one of the plurality of the protection protruding portions passes a top of the side wall of the housing before distal ends of the cover engaging portions pass the top of the side wall of the housing.

17. A light scanning apparatus, comprising:

a light source configured to emit a light beam;

a rotary polygon mirror configured to deflect the light beam to cause the light beam emitted from the light source to scan a photosensitive member in a scanning direction;

an optical member configured to guide the light beam deflected by the rotary polygon mirror to the photosensitive member;

a housing configured to contain the light source, the rotary polygon mirror, and the optical member; and a cover member as recited in claim 10.

18. A light scanning apparatus according to claim 17, wherein the at least three protruding portions are located without blocking an optical path of the light beam in the housing.

19. An image forming apparatus, comprising:

a photosensitive member;

a light scanning apparatus as recited in claim 17, the light scanning apparatus emitting a light beam to the photosensitive member to form an electrostatic latent image;

a developing unit configured to develop the electrostatic latent image formed by the light scanning apparatus to form a toner image; and a transfer unit configured to transfer the toner image formed by the developing unit onto a recording medium.

* * * * *